United States Patent
Kriisa

(10) Patent No.: US 8,581,469 B2
(45) Date of Patent: Nov. 12, 2013

(54) DEVICE FOR CONVERTING THERMAL ENERGY INTO ELECTRICAL ENERGY

(75) Inventor: Toomas Kriisa, Decatur, IL (US)

(73) Assignee: Kriisa Research, Inc., Decatur, IL (US)

( * ) Notice: Subject to any disclaimer, the term of this patent is extended or adjusted under 35 U.S.C. 154(b) by 0 days.

(21) Appl. No.: 13/242,639

(22) Filed: Sep. 23, 2011

(65) Prior Publication Data

US 2012/0012147 A1 Jan. 19, 2012

Related U.S. Application Data

(62) Division of application No. 11/336,354, filed on Jan. 20, 2006, now Pat. No. 8,053,947.

(60) Provisional application No. 60/750,575, filed on Dec. 14, 2005.

(51) Int. Cl.
*H02N 10/00* (2006.01)
*H01J 45/00* (2006.01)
*H02N 3/00* (2006.01)

(52) U.S. Cl.
CPC . *H01J 45/00* (2013.01); *H02N 3/00* (2013.01)
USPC ............ 310/306; 310/311; 136/200; 136/205

(58) Field of Classification Search
CPC .................................. H01J 45/00; H02N 3/00
USPC ............................ 310/306, 311; 136/200, 205
IPC ....................................................... H02N 10/00
See application file for complete search history.

(56) References Cited

U.S. PATENT DOCUMENTS

| 3,169,200 | A | * | 2/1965 | Huffman | 310/306 |
| 3,333,140 | A | * | 7/1967 | Chapman | 428/381 |
| 3,402,074 | A | * | 9/1968 | Chapman et al. | 428/615 |

(Continued)

FOREIGN PATENT DOCUMENTS

| WO | WO 01/69657 A2 | 9/2001 |
| WO | WO 01/69657 A3 | 9/2001 |
| WO | WO 2004/084272 A2 | 9/2004 |
| WO | WO 2004/084272 A3 | 9/2004 |

OTHER PUBLICATIONS

Doland, Ph.D. dissertation, "Molybdenum Silicide Formation on Single Crystal, Polycrystalline and Amorphous Silicon: Growth, Structure and Electrical Properties", U. of Houston, 1988.*

(Continued)

*Primary Examiner* — John K Kim
(74) *Attorney, Agent, or Firm* — Brinks Hofer Gilson & Lione

(57) ABSTRACT

A current source and method of producing the current source are provided. The current source includes a metal source, a buffer layer, a filter and a collector. An electrical connection is provided to the metal layer and semiconductor layer and a magnetic field applier may be also provided. The source metal has localized states at a bottom of the conduction band and probability amplification. The interaction of the various layers produces a spontaneous current. The movement of charge across the current source produces a voltage, which rises until a balancing reverse current appears. If a load is connected to the current source, current flows through the load and power is dissipated. The energy for this comes from the thermal energy in the current source, and the device gets cooler.

7 Claims, 10 Drawing Sheets

(56) References Cited

U.S. PATENT DOCUMENTS

| | | | | |
|---|---|---|---|---|
| 5,644,184 | A * | 7/1997 | Kucherov | 310/306 |
| 6,489,704 | B1 * | 12/2002 | Kucherov et al. | 310/306 |
| 6,779,347 | B2 * | 8/2004 | Kucherov et al. | 62/3.1 |
| 8,053,947 | B2 * | 11/2011 | Kriisa | 310/300 |
| 2004/0050415 | A1 * | 3/2004 | Kucherov et al. | 136/252 |
| 2007/0131267 | A1 * | 6/2007 | Kriisa | 136/202 |
| 2012/0012147 | A1 * | 1/2012 | Kriisa | 136/205 |

OTHER PUBLICATIONS

Wikipedia, "Current and Electron theory", http://en.wikipedia.org/wiki/Electric_current, 2012.*

Wikipedia, "PN junction theory", http://en.wikipedia.org/wiki/P%E2%80%93n_junction, 2012.*

Wikipedia, "Bipolar junction theory", http://en.wikipedia.org/wiki/Bipolar_junction_transistor, 2012.*

Wikipedia, "Thermal Emission theory", http://en.wikipedia.org/wiki/Thermionic_emission, 2012.*

International Search Report PCT Application No. PCT/US2006/047403, dated May 21, 2008.

Anderson, P.W. (1958) "Absence of Diffusion in Certain Random Lattices," Phys. Rev. 109: pp. 1492-1505.

Duma et al., "*Electrical Conductivity and Thermoelectric emf of Nickel and Molybdenum Films*," 1993 Plenum Publishing Corporation, (pp. 1123-1126). Listed as Exhibit 1 in the Rule 132 Declaration filed Oct. 26, 2010.

Charles Kittel, "*Introduction to Solid State Physics*," Eighth Edition—Chapter 18, Nanostructures, written by Professor Paul McEuen of Cornell University—John Wiley & Sons, Inc., (5 pgs.). Listed as Exhibit II in the Rule 132 Declaration filed Oct. 26, 2010.

Lucks, C.F., "Pyrometric Standard Lead as a Thermal-Conductivity Reference Material," Battelle Memorial Institute, Columbus Laboratories, Columbus, Ohio, (Received Sep. 22, 1996), pp. 1973-1974.

Lucks, C.F., "Correlations of Thermal and Electrical Conductivities of Two Pyrometric Standard Lead Samples," Battelle Memorial Institute, Columbus Laboratories, Columbus, Ohio, (Received Feb. 23, 1970), pp. 3550-35351.

* cited by examiner

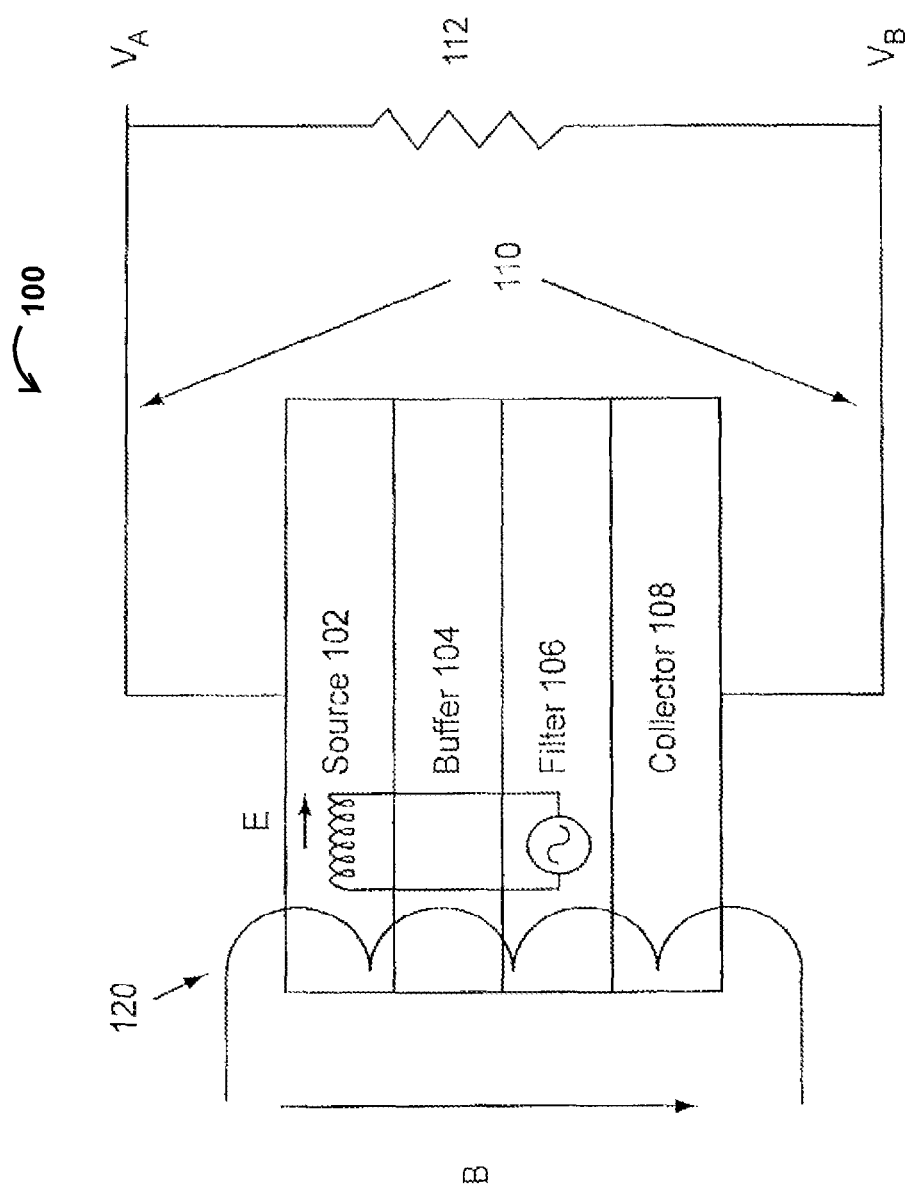

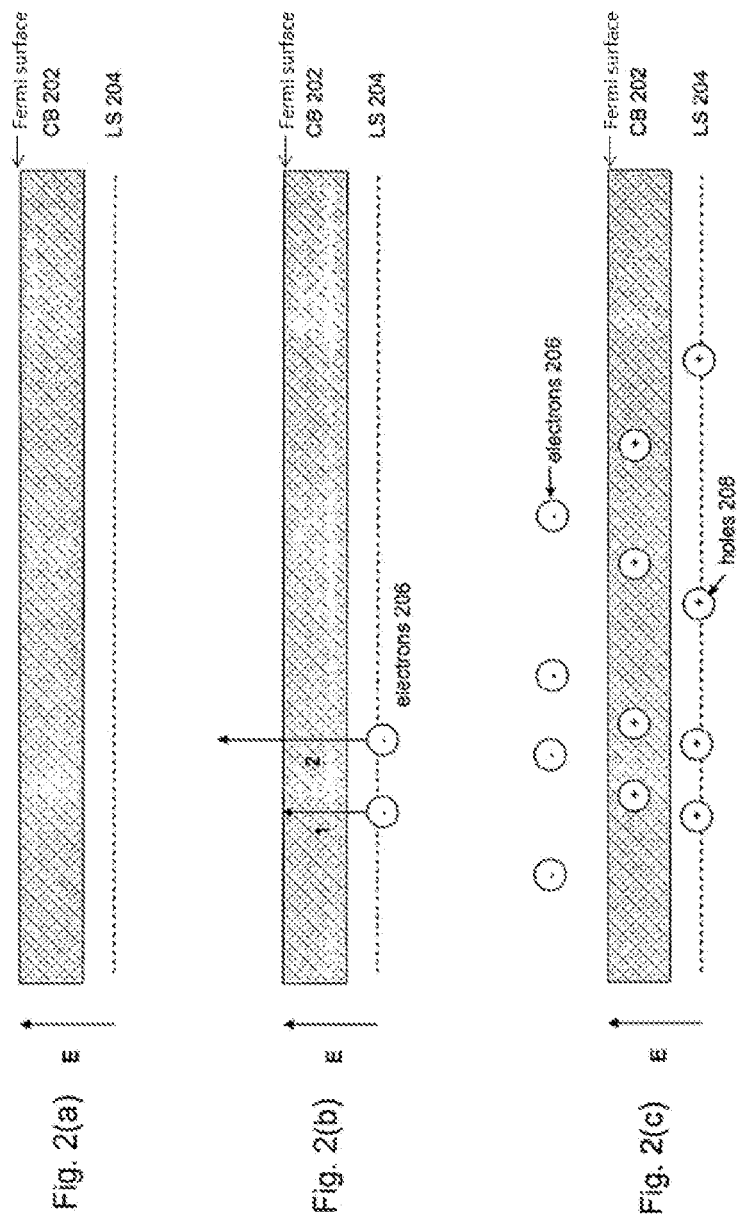

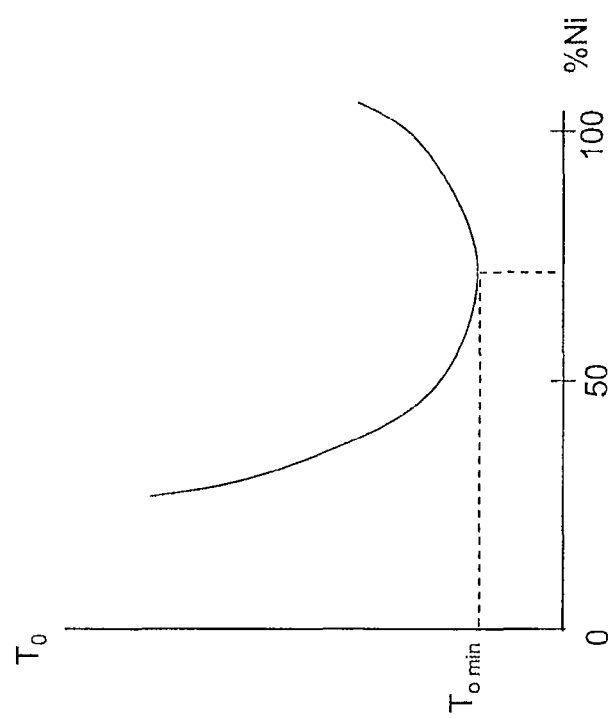
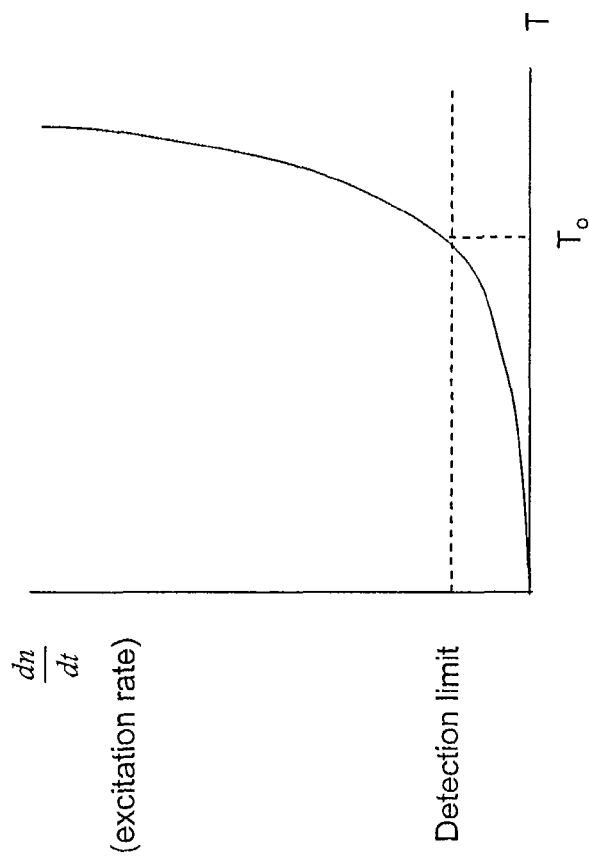
Fig. 3(a)
Fig. 3(b)

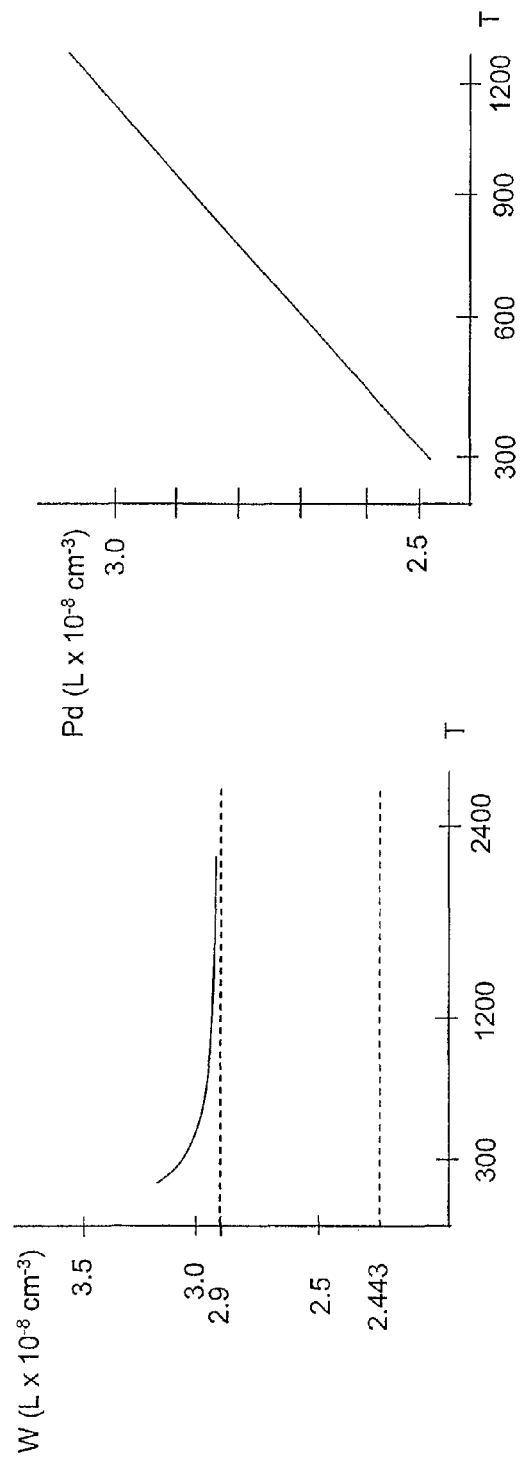
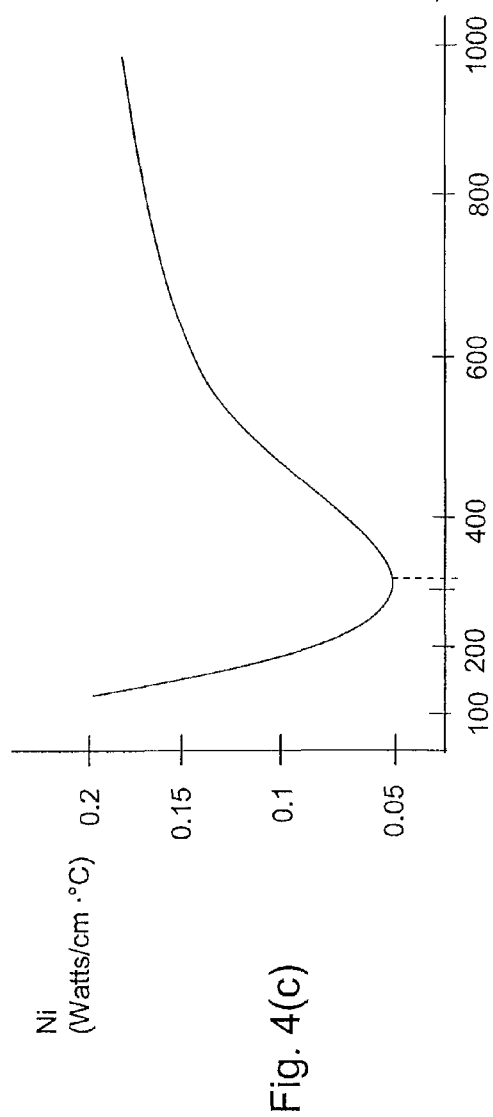
Fig. 4(a)
Fig. 4(b)
Fig. 4(c)

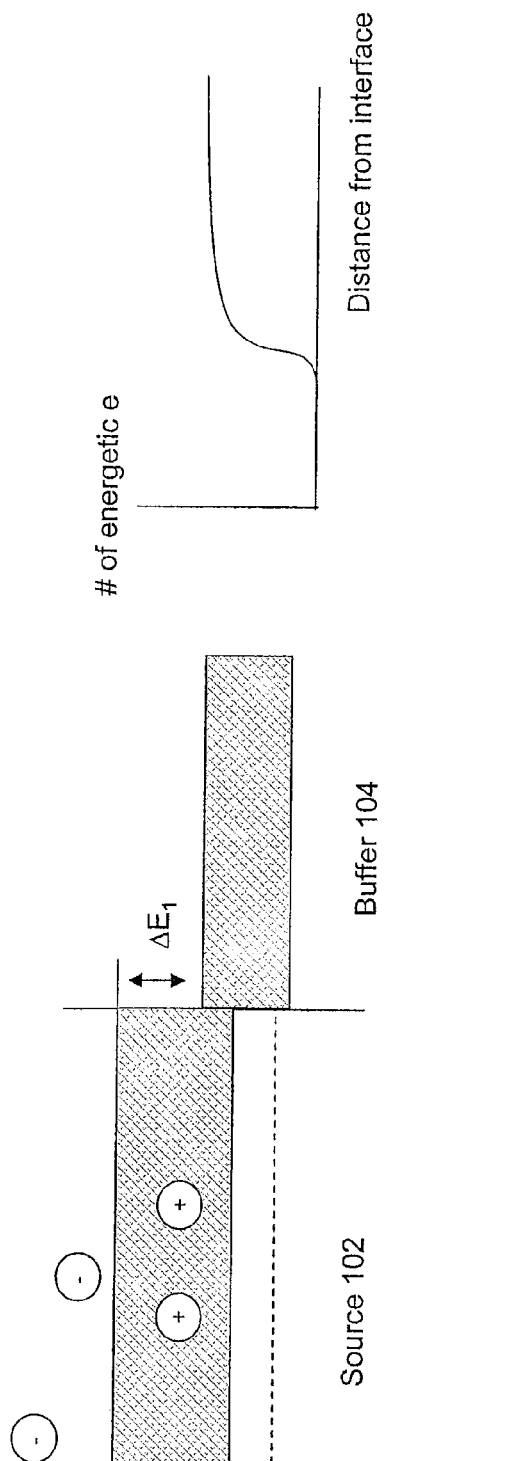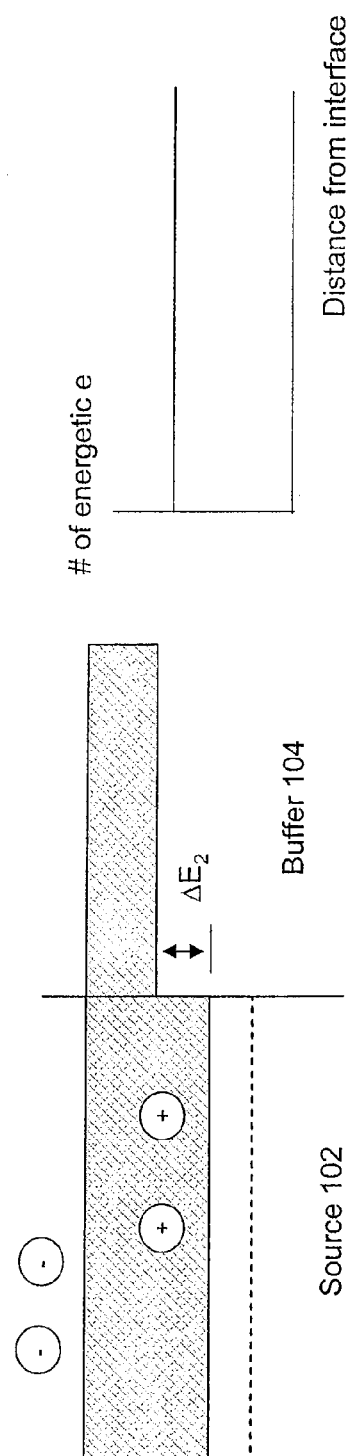
Fig. 5

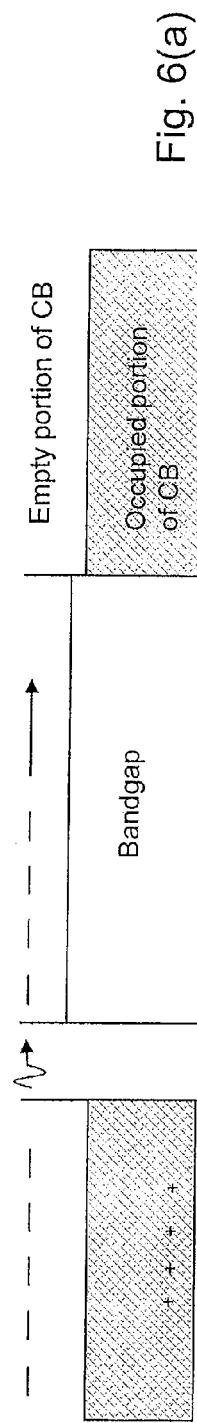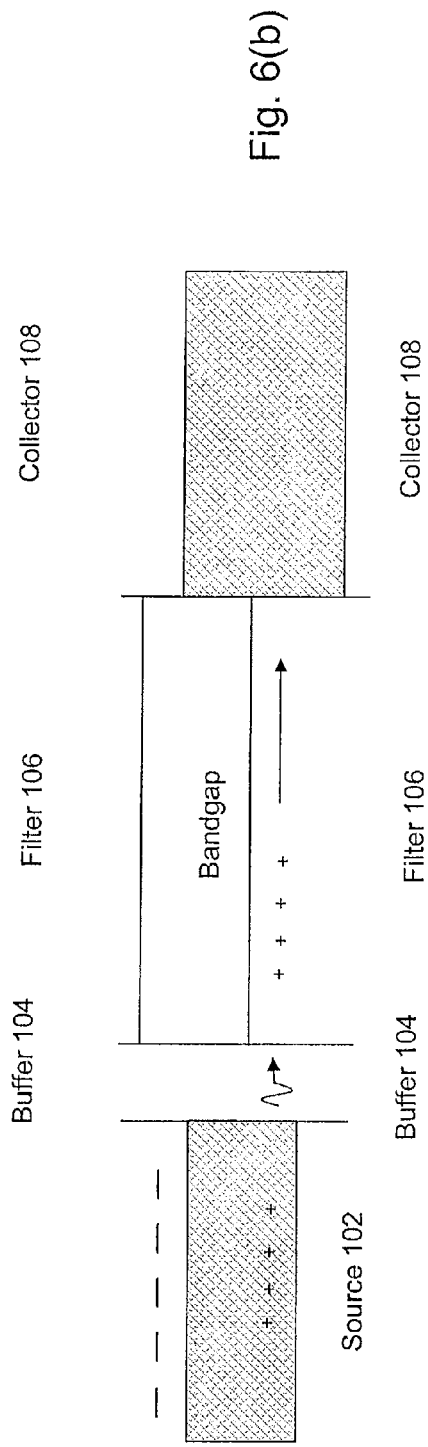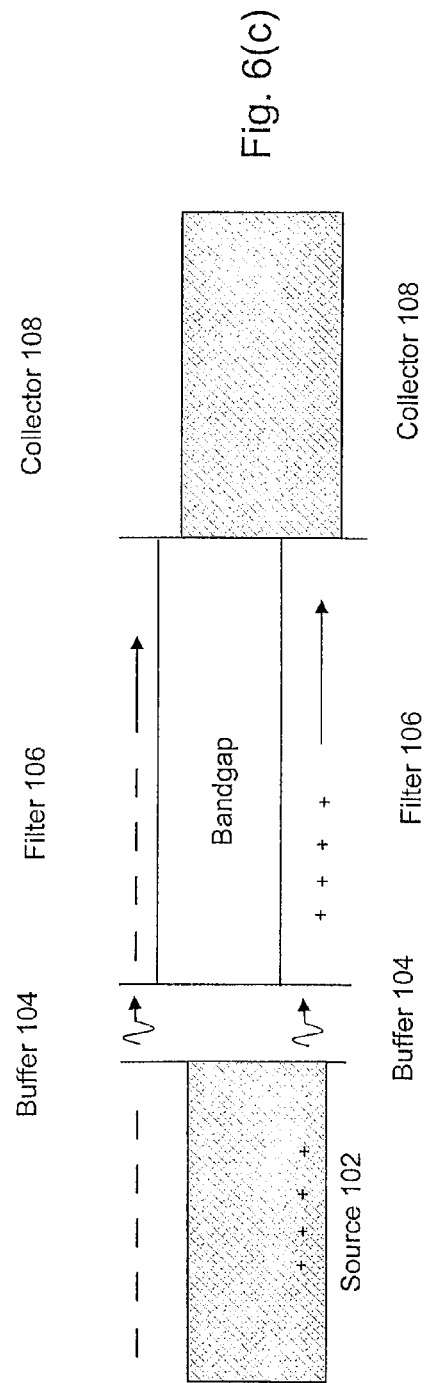

DEVICE FOR CONVERTING THERMAL ENERGY INTO ELECTRICAL ENERGY

PRIORITY

This application is a divisional application of U.S. patent application Ser. No. 11/336,354, filed Jan. 20, 2006 now U.S. Pat. No. 8,053,947, which claims the benefit of priority to Provisional Application 60/750,575, filed Dec. 14, 2005, all of which are herein incorporated by reference in their entirety.

TECHNICAL FIELD

The present invention relates to a current source. More specifically, the present invention relates to a current source containing metals, semiconductors and insulators.

BACKGROUND

In solids, a number of energy bands exist. These energy bands include a valence band and a conduction band. The conduction band is at higher energy than the valence band. Each energy band contains multiple states in which a charged carrier (electron or hole) may be present. In semiconductors and insulators, the conduction band is separated from the valence band by a bandgap. There are essentially no states in the bandgap.

In semiconductors and insulators, at zero temperature and under no excitation conditions, the states in the valence band are completely populated by electrons, while the states in the conduction band are completely populated by holes, i.e. empty of electrons. In metals, on the other hand, the conduction band and the valence band are the same. Thus, metals are highly conductive as electrons are essentially free to move around from a populated state to an unpopulated state. Ideally, in insulators or undoped semiconductors, on the other hand, the conductivity is relatively low because the electrons completely populate the valence band and thus no states are available to which the electrons are able to move. However, there is a finite conductivity in insulators or undoped semiconductors due to thermal excitation. Some of the electrons in the valence band receive enough energy to transition across the bandgap. Once the electrons are in the conduction band, they can conduct electricity, as can the hole left behind in the valence band. As the bandgap increases, the conductivity decreases exponentially. Thus, the bandgap is zero in a metal as the conduction band and valence band overlap, the bandgap is greater than about 4 eV in insulator (e.g. 8.0 eV for $SiO_2$), and between zero and about 4 eV in a semiconductor.

Energy bands are shown in momentum space. That is, the energy bands of a solid are illustrated in terms of the relationship between the available states in energy and momentum. Other constructs are useful in characterizing solids. For example, in solid-state physics a Fermi surface is often used to describe various aspects of a solid. A Fermi surface is an abstract boundary or interface useful for characterizing and predicting the thermal, electrical, magnetic, and optical properties of metals, semimetals, and semiconductors. The Fermi surface is related to the periodicity of a lattice that forms a crystalline solid (i.e. the distance between elements forming the lattice) and to the occupation of electron energy bands in such materials. The Fermi surface defines a surface of constant energy in momentum space. The Fermi surface, at absolute zero, separates the unfilled states from the filled states. The electrical properties of the material are determined by the shape of the Fermi surface, because the current is due to changes in the occupancy of states near the Fermi surface.

Many electronic and other devices use metals, insulators, and semiconductors. One example of such a device includes a current source. A current source is a device that supplies substantially a constant amount of current independent of the voltage across its terminals. An ideal current source produces the voltage used to maintain a specified current. Many electronic devices use circuit arrangements that contain current sources.

BRIEF DESCRIPTION OF THE DRAWINGS

The present invention is illustrated by way of example and not limited to the accompanying figures in which like references indicate similar elements.

FIG. 1 illustrates one embodiment of a current source.

FIGS. 2a, 2b, 2c show a band diagram illustrating electron transitions in an embodiment of the source in FIG. 1.

FIGS. 3a, 3b are graphs of the rate of excitations vs. temperature and the minimum detection temperature vs. Ni composition, respectively, in the embodiment of the source in FIG. 1.

FIGS. 4a, 4b, and 4c are graphs of L for W, Pd, and Ni vs. temperature, respectively, in the embodiment of the source in FIG. 1.

FIGS. 5a and 5b illustrate band diagrams of a source and different buffers in the embodiment of FIG. 1.

FIGS. 6a, 6b, 6c show band diagrams of embodiments of different current sources.

Figure 7A:
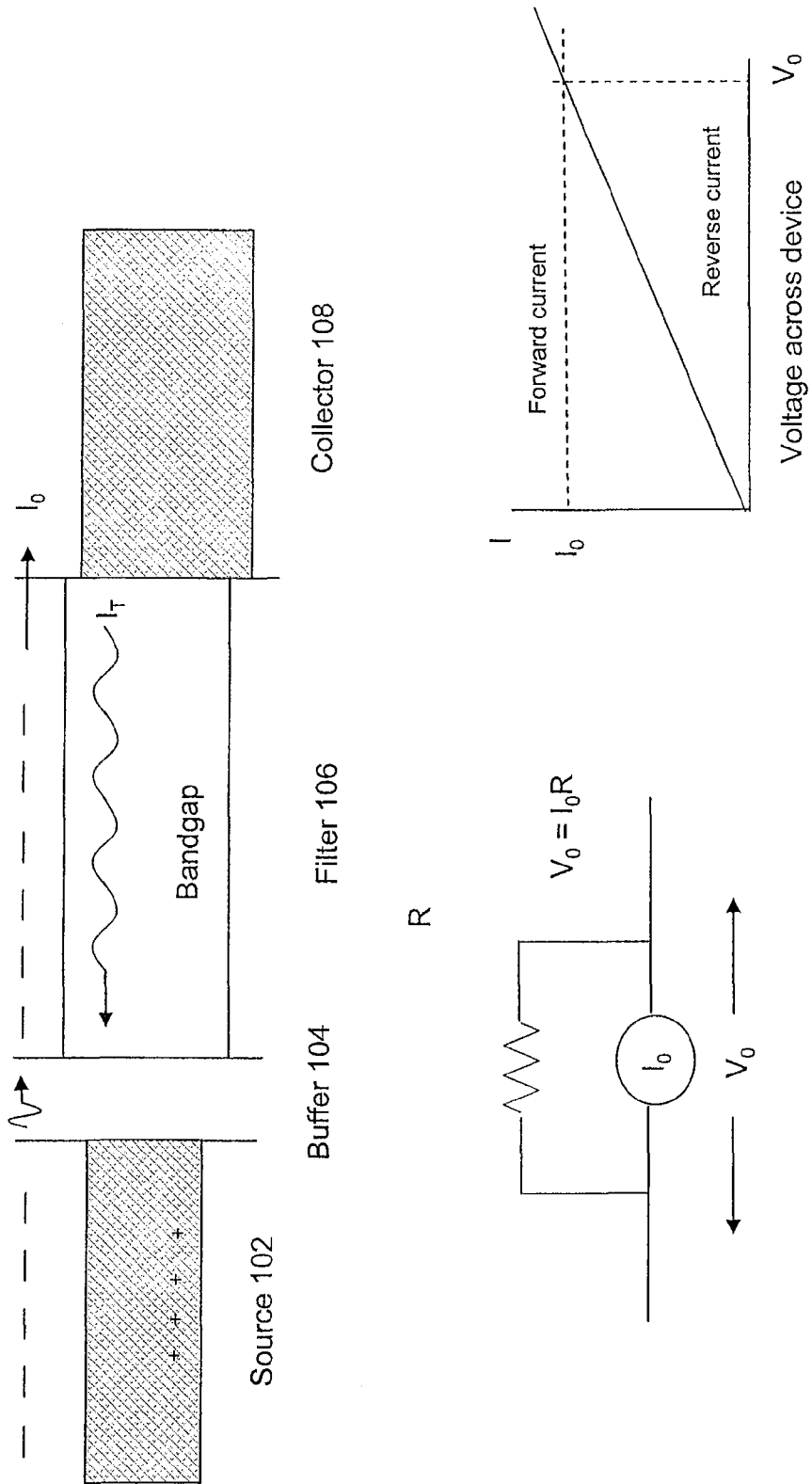
FIGS. 7a, 7b, 7c show band diagrams and associated equivalent circuits and current-voltage graphs of embodiments of different current sources.

Skilled artisans appreciate that elements in the figures are illustrated for simplicity and clarity and have not necessarily been drawn to scale.

DETAILED DESCRIPTION

A current source and method of producing the current source is provided. The current source includes at least a metal layer and a semiconductor layer. An electrical connection is provided to the metal layer and semiconductor layer and a magnetic field applier may be provided. The interaction of the layers produces a spontaneous current. The movement of charge across the current source produces a voltage, which rises until a balancing reverse current appears. If a load is connected to the current source, current flows through the load and power is dissipated. The energy for this comes from the thermal energy in the current source, and the device gets cooler.

Referring to FIG. 1, in one embodiment, the current source 100 includes four layers 102, 104, 106, and 108. The four layers include a source 102, a buffer 104, a filter 106, and a collector 108. Each of the four layers contacts at least one other layer; i.e. the source 102 contacts the buffer 104, the buffer 104 contacts the filter 106, and the filter contacts the collector 108. Leads 110 from which current may be extracted are electrically connected to the source 102 and the collector 108. A magnetic field B may be applied in a direction substantially perpendicular to the layers 102, 104, 106, 108 via a magnetic source 120, such as a coil.

Although the layers 102, 104, 106, and 108 are shown as single layers, one or more of these layers 102, 104, 106, and 108 may be multiple layers. The interaction of the source 102, buffer 104, filter 106, and collector 108 produces a spontaneous current. The movement of charge across the current source 100 produces a voltage, which rises until a balancing reverse current appears. If a load 112 is connected to the current source 100 through leads 110, current flows through the load 112 and power is dissipated. The energy for this comes from the thermal energy in the current source 100, and the current source 100 gets cooler.

The source 102 is a metal or mixture of metals which has localized states at the bottom of the conduction band. The localized states 204 at the bottom of the conduction band 202 are shown schematically in FIG. 2a. Interactions between electrons near the Fermi surface and the localized electrons trapped on the localized states 202 occasionally elevate the localized electrons to the Fermi surface as shown in FIG. 2b as transition 1. The energy for this transition is between about 1 and 6 eV and comes from the energy of collisions of the localized electron with multiple free electrons. Normal collisions return an electron to the localized state and produce excess electrons above the Fermi surface and excess holes below, as shown in FIG. 2b as transition 2 and in FIG. 2c. These energetic electrons and holes may be the source of the current. Interactions between localized electrons and phonons can also elevate the localized electrons to the Fermi surface. In this case the energy for the transition comes from multiple phonons.

A suitable source metal has at least two properties. First, the source has localized states at the bottom of its conduction band. These states should have an energy E, about 0.01 eV<E<about 0.05 eV below the bottom of the conduction band. The number of these states should be low enough so that their overlap is small. This is to say that the number of states should be small enough so that the levels are not degenerate (i.e. they do not spread into an impurity band that merges with the conduction band). In one embodiment, the concentrations are less than about 1000 ppm (part per million). Second, the probability of transition 1 shown in FIG. 2b occurring in the source should be large enough to produce enough energetic electrons. Localized states in the metal can be produced in three ways: disorder in the metal, small amounts of impurities, or an applied magnetic field (shown in FIG. 1).

A disordered metal, or a metal with some degree of disorder, can be defined as a metal whose potential for conduction electrons is non-periodic. For a small amount of disorder, it may be possible to divide the potential into two parts, Vp (which has the periodicity of the lattice) and Vnp (which is non-periodic). The relative size of Vnp and Vp can be taken as a measure of the degree of disorder. There are a number of ways for a metal to have disorder. It may be an alloy of two or more metals whose atoms are randomly distributed throughout the lattice. It may have a number of impurities whose size is significantly different from the size of the host metal atoms. The impurity atoms push their nearest neighbors to slightly different positions, those atoms push their nearest neighbors, and so on. A pure metal may consist of more than one stable isotope. The different isotopes will be randomly distributed throughout the lattice, producing a slightly disordered potential. The metal may be in a metastable mixture of two different crystal forms, in a structure called random stacking. Or the metal may be a transition metal with localized magnetic moments pointing in random directions. The non-periodic potential will produce localized states at the bottom of the conduction band through the process of Anderson localization. Disordered metals can be divided into two classes, pure metals and mixtures. Atoms of transition metals and rare earth metals have partially filled d-shells. Transition metals are elements that are characterized by the filling of an inner d electron orbital (or shell) as atomic number increases. Transition metals includes include the elements with atomic numbers 21 to 30, 39 to 48, 58 to 80, and 89 to 112, i.e. and in particular, from titanium to copper and those elements lying in the columns therebelow in the International Union of Pure and Applied Chemistry (IUPAC) periodic table.

The transition metals have randomly oriented magnetic moments due to the incomplete filling of the d shell. The random orientation of the magnetic moments of these shells may produce a disordered potential for the conduction electrons in these metals. In particular, the potential that a conduction electron experiences while on an atom may depend on the relative orientations of the magnetic moments of the atom and its nearest neighbors. Most of the transition metals have crystal structures in which every atom has 12 nearest neighbors. Most of the remaining transition metals have structures with 8 nearest neighbors. It may be that, for an atom to have a low enough potential to produce a localized state with E>about 0.01 eV below the bottom of the conduction band, 9 of its nearest neighbors have magnetic moments aligned with its magnetic moment, and 3 are anti-aligned with its magnetic moment. With randomly aligned moments, the fraction of atoms with localized states may be low enough to satisfy the conditions listed above.

The normal situation is more complicated, because most d shells have more than two possible orientations, (j>½, where j is the angular momentum quantum number), but the same principle may apply. In the ferromagnetic metals Fe, Co, and Ni, the relative orientations of neighboring magnetic moments is not random for $T<T_c$ (the Curie temperature). At T=0, all the magnetic moments are aligned and there is no possibility of an atom having a lower potential than the average. As temperature is increased, disorder increases. At some temperature To it becomes possible for some atoms to have localized states. As the temperature is further increased, the number of localized states increases.

In mixtures of two or more metals, the random positions of the different atoms may produce a disordered potential. Mixtures can be comprised of metals that normally dissolve in each other, such as Ni—Cu, Pd—Ag, Pt—Au, or of metals that do not normally mix but can be deposited in a mixed state. Examples of metals that do not normally mix include Fe—Co and Ti—V.

Turning away from disordered metals to metals containing impurities, some impurities in certain metals may produce localized states. For non-transition metals (such as those in col. 2 and 13-17 in the new IUPAC notation), the impurity metal should be of the same column of the periodic table as the parent metal, and usually lower in the column. For instance, Ga or In may be used as impurities in Al or K or Rb may be used as impurities in Na. However, there are also exceptions to these rules; for instance, Bi impurities in Pb produce localized states. For transition metals, the impurity metal can be of the same column as the parent metal or of a column to the right of the column of the parent metal. Cu in Ni is one such example.

The concentration of the impurity atoms can range from less than 1 part per million up to an upper limit in which the isolated localized states overlap and merge to become the disordered localized states. For low concentrations (<1000 ppm—part per million), the number of energetic electrons produced is proportional to the concentration of impurities.

Rather than provide impurities, an external magnetic field can be applied to produce the current source. If a magnetic field is applied to a metal, states that are localized in two dimensions, called Landau states, are produced at the bottom of the conduction band. To produce the Landau states, the metal is substantially free of disorder. For example, the purity of a non-transition metal should be greater than about 99.9% (e.g. less than 10 ppm). As shown in FIG. 1, the magnetic field B is applied substantially perpendicular to the surface of the source 102.

Ordinarily, the excitation of an electron from a localized state at the bottom of the conduction band to the Fermi surface happens extremely rarely. It is possible to increase the frequency of this event through a process which will subsequently be referred to as probability amplification. Probability amplification can occur in transition metals as a result of the interaction of the incomplete d-shells of neighboring atoms and thermal vibrations (phonons) of the atomic lattice. In non-transition metals, probability amplification can be produced close to the physical surface of the metal (e.g. within about 100 Å) by the application of an alternating electric field and a non-parallel magnetic field B.

In a given metal, a probability amplification value can be assigned for electrons in each band and for phonons. For instance, a transition metal with an S band and a D band has probability amplification values PAS (S-band), PAD (D-band), and PAL (phonon). In many metals, the intrinsic probability amplification of electrons is large compared to externally produced probability amplification, making the probability amplification essentially independent of external factors such as applied magnetic field, applied electric field, temperature, and pressure. For metals with one conduction band, the value of probability amplification for electrons varies inversely with the ease with which the electrons move from atom to atom. S-electrons move most easily, so PAS is relatively small. P-electrons move less easily, so PAP (probability amplification in the P-band) is larger. D-electrons move much less easily, so PAD is much larger. F-electrons in rare-earth metals move with so much difficulty that they do not form a band at all, so these rules do not apply to them.

The same trend applies from metal to metal. In the Cr, Mo, W group, d-electrons move easily, so PAD is relatively small. As one moves to the right in the periodic table, d-electrons become less mobile and PAD increases, until the Ni, Pd, Pt group, where PAD is greatest. There is the same variation within columns. The d-shell in row 5 atoms tends to be deeper than in row 4 or 6 atoms. So for instance, PAD in Pd is larger than PAD in Ni or Pt. For metals with more than one conduction band, interactions between electrons in different shells in an atom can influence the probability amplification of a band. In transition metals, PAS is larger (but still much smaller than PAD) than PAS in non-transition metals because of the interaction between the s and d shells. PAS will be largest in those transition metals with the largest PAD.

The probability amplification of phonons PAL and electrons can be influenced by external factors. One way PAL can be achieved close to the physical surface (e.g. within about 100 Å) is, as indicated above, by the application of an alternating E-field and a B-field. The electric and magnetic fields are not parallel to each other.

One way to apply the electric field is to have the neighboring layer or layers (i.e. the buffer layer 104 or the filter layer 106) be a material which has a high density of optically active localized phonon modes. The material thus has a large number of charged atoms that are vibrating, producing an alternating electric field (schematically illustrated in FIG. 1). This alternating electric field is able to penetrate a short distance into the source 102. Typical frequencies of vibration of the charged atoms extend between about 1012 to 1013 Hz. For a vibration frequency of about 1013 Hz, for example, Cu has a skin depth of 200 Å. For other metals, the depth may be different.

The magnetic field can be applied externally. In different embodiments, the magnetic field can be applied by placing the current source 100 in a solenoid 120 (as shown in FIG. 1) or by placing permanent magnets nearby. The output of the source 102 can then be controlled by changing the strength of the applied magnetic field.

In addition, the probability amplification increases with temperature. At low temperatures, the number of excitations per unit time and unit volume, dn/dt, is below the detectable limit, as shown in FIG. 3a. At a finite turn on temperature, $T_o$, dn/dt becomes detectable and rises rapidly with temperature. The value of $T_o$ for a given metal is determined by the nature of the localized states and the effectiveness of probability amplification. The value of $T_o$ for mixtures can be varied continuously over a predetermined range by varying the composition of the particular mixture. In Cu—Ni alloys, for instance, disorder is greatest close to 50% Cu-50% Ni. Only the Ni atoms have incomplete d-shells so the probability amplification increases with increasing Ni content. A graph of $T_o$ versus composition for this series of alloys is predicted to have the form shown in FIG. 3b.

The thickness of the source 102 can vary from few atomic thicknesses (about 10 Å) to a maximum thickness desired for the overall current source 100. For thicknesses below about 100 Å, a buffer may be used on one or both sides of the source 102.

Since transition metals have disorder and probability amplification, they can all be considered candidates to be source metals. Many of the transition metals have turn on temperatures To that are too high to be practical. The turn on temperatures To can be determined using the thermal conductivity, electrical conductivity, and thermopower of transition metals at a series of temperatures. More particularly, the turn on temperatures To can be determined using equation (1): An upper bound for the turn on temperature may be estimated for some metals using thermal conductivity, electrical resistivity, and thermopower data at a series of temperatures. The Lorenz number L is defined by equation (1):

$$L=(k*r)/T+S2 \qquad (1)$$

In equation (1), k is the thermal conductivity, r is electrical resistivity, and S is thermopower of the metal. L should approach a magnitude of $2.443 \times 10\text{-}8$ watt-ohm/(° C.)$_2$ at high temperatures. Seven metals which have significant deviations from this are Mo, W, Ni, Pd, Pt, Fe and Co. Data for Pd, W, and Ni are shown in Tables 1, 2a and 2b, and 3 and illustrated in FIGS. 4a, 4b, and 4c. ΔK in the tables is the amount of thermal conductivity in addition to that due to the conduction electrons that must exist in the metal to achieve the measured L. ΔK can be calculated from eq. (1) using measured k, r, and S. If this additional thermal conductivity comes from lattice thermal conductivity (the only conventional possibility), its value should be proportional to 1/T, for temperatures greater than the Debye temperature of the metal. Any part of ΔK not attributable to lattice thermal conductivity, especially a ΔK increasing with temperature may be an indication of thermal conductivity from excitation of electrons from localized states-meaning both localized states and probability amplification are present in the metal. However, while these seven metals may make good source metals, use of L vs. T data alone may not rule out metals to use. Excitation of localized states does not always affect thermal and electrical conductivity. Mixtures of metals can be investigated in the same way. Cu—Ni, Ag—Pd, and Au—Pt alloys may be good source metals. The rate of excitation of localized states in a metal can be increased by increasing the amount of disorder, or by increasing the probability amplification. To have a measurable effect on thermal conductivity, and thus on L, the localized states should be large (~1000 Å or more) with a high rate of excitation. Spread out localized states imply low disorder, so to achieve a high rate of excitation a relatively large probability amplification is needed. So the deviations in L seen for the seven metals indicates they have a high degree of probability amplification. Nearest neighbors on the periodic table to these seven could be expected to have higher than average probability amplification values. For mixtures of metals, the amount of disorder can be greatly increased, so the level of probability amplification does not need to be as large. Therefore all transition metals are good candidates for source metals in alloys.

TABLE 1

Palladium (Pd)

| T (K) | Thermal conductivity (watts/ cm*deg) | Electrical resistivity (ohm-cm)*$10^6$ | Thermo-power (micro-volts/deg) | $L + S^2$ ($\times 10^8$) | $\Delta K$ (watts/ cm*deg C.) |
|---|---|---|---|---|---|
| 100 | .737 | 2.595 | 2.0 | 1.91 | 0.066 |
| 200 | .707 | 6.858 | −4.85 | 2.43 | 0.081 |
| 300 | .721 | 10.765 | −10.69 | 2.60 | 0.090 |
| 400 | .741 | 14.422 | −13.6 | 2.69 | 0.098 |
| 600 | .797 | 21.056 | −19.3 | 2.83 | 0.105 |
| 800 | .870 | 26.856 | −25.71 | 2.99 | 0.142 |
| 1000 | .949 | 31.878 | −32.26 | 3.13 | 0.183 |
| 1200 | 1.02 | 36.168 | −38.46 | 3.22 | 0.209 |

TABLE 2a

Tungsten (W)

| T (K) | Thermal conductivity (watts/cm*deg) | Electrical resistivity (ohm-cm)*$10^6$ | L ($\times 10^8$) | $\Delta K$ (watts/cm*deg C.) |
|---|---|---|---|---|
| 300 | 1.76 | 5.48 | 3.21 | 0.576 |
| 400 | 1.59 | 7.91 | 3.14 | 0.452 |
| 600 | 1.37 | 13.14 | 3.00 | 0.308 |
| 800 | 1.26 | 18.78 | 2.96 | 0.238 |
| 1000 | 1.19 | 24.72 | 2.94 | 0.211 |
| 1200 | 1.14 | 30.9 | 2.94 | 0.191 |
| 1600 | 1.06 | 44.03 | 2.92 | 0.186 |
| 2000 | 1.01 | 57.62 | 2.91 | 0.162 |
| 2400 | .97 | 72.04 | 2.91 | 0.156 |

TABLE 2b

Tungsten

| T1 | T2 | $\Delta K(T1)/\Delta K(T2)$ | $\Delta K(T1)/\Delta K(T2)$ theoretical |
|---|---|---|---|
| 400 | 600 | 1.47 | 1.50 |
| 600 | 800 | 1.29 | 1.33 |
| 800 | 1000 | 1.13 | 1.25 |
| 1000 | 1200 | 1.10 | 1.20 |
| 1200 | 1400 | 1.02 | 1.17 |

TABLE 3

Nickel (Ni)

| T (K) | Thermal conductivity (watts/ cm*deg) | Electrical resistivity (ohm-cm)*$10^6$ | Thermo-power (micro-volts/deg) | $L + S^2$ ($\times 10^8$) | $\Delta K$ (watts/ cm*deg C.) |
|---|---|---|---|---|---|
| 100 | 1.64 | .986 | −8.50 | 1.62 | 0.21 |
| 150 | 1.22 | 2.237 | −10.98 | 1.83 | 0.11 |
| 200 | 1.07 | 3.703 | −13.45 | 2.00 | 0.07 |
| 250 | .975 | 5.384 | −16.35 | 2.13 | 0.06 |
| 300 | .907 | 7.237 | −19.52 | 2.23 | 0.05 |
| 400 | .802 | 11.814 | −23.99 | 2.43 | 0.07 |
| 500 | .722 | 17.704 | −25.75 | 2.62 | 0.10 |
| 600 | .656 | 25.554 | −22.16 | 2.84 | 0.13 |
| 1000 | .718 | 41.496 | −29.85 | 3.07 | 0.15 |
| 1200 | .762 | 46.728 | −35.42 | 3.09 | 0.167 |

The tables illustrate three cases. $\Delta K$ for Pd increases with T monotonically from 100K to 1200K. It is hard to estimate a To but 200K is a reliable upper bound. $\Delta K$ decreases with T at low temperatures for Ni, reaches a minimum at 300K, and increases with T for T>300K. An upper bound of 300K is a safe upper bound. This is consistent with our understanding of disorder in Ni. Nickel is ferromagnetic below 620K. At 0K all the localized magnetic moments are aligned and there is no disorder due to them. As the temperature is increased, more and more magnetic moments become misaligned until they are all pointing in random directions at 620K. At a temperature between 0K and 620K, there will be the right amount of disorder, large enough to have excitations and small enough to have large localized states. Table 2b shows the ratio of the change in temperature ($\Delta K$) for a series of pairs of temperatures, as well as the theoretical ratio of the $\Delta K$ derived exclusively due to lattice thermal conductivity. For W, significant deviations begin between T=600K and T=800K. This can be taken as the approximate value of To for W, 600<To<800K. This To could be lowered with the techniques of probability amplification discussed earlier. For Pd, $\Delta K$ increases with T for all T>100K. An estimate of To for Pd is To<200K. For Ni, $\Delta K$ decreases with T for T<300K and increases with T for T>300K. To can be taken as approximately 250<To<350K for Ni. Since Ni is ferromagnetic below T=620K, this value of To is determined by the growing number of localized states, as discussed above. Fe and Co show the same behavior, with To (Fe) about 370K and To (Co) about 500K. Small amounts of impurities in these three ferromagnetic metals can reduce their Curie temperatures, which would also reduce To. $\Delta K$ for W never increases with temperature but the ratios of $\Delta K$ for two different temperatures (as shown in Table 2b) differ from what would be expected for pure lattice conductivity and are consistent with an additional contribution to thermal conductivity from excitation of localized states that is constant with temperature. It is difficult to estimate a To, but excitations appear to be present at T=800K. Note that the these estimates of To for these metals are for the interiors of the metals. Values and values of To near the surface may be different, usually higher, due to possibly lower because of different levels of probability amplification for atoms near the surface.

The seven metals which may be the best candidates for source metals among the transition metals are Mo, W, Ni, Pd, Pt, Fe, and Co. Each of the L vs. T data for these metals indicates the presence of excitations. The transition metals that are in the same column as one of these metals, but whose L vs. T data show no evidence of excitations, may also be promising. These metals include Cr, Ru, Rh, Os, and Ir. The rest of the transition metals may be poorer candidates than the metals already mentioned.

Source metals with isolated impurity atoms have already been discussed. If the host metal is a transition metal, probability amplification can be intrinsic to the metal. If the host metal is a non-transition metal without impurities generating disorder, probability amplification may be provided from outside the metal. If the localized states are produced by a magnetic field, the metal is essentially free of disorder without the application of the magnetic field. In this case, any pure non-transition metal may be used, for example Al or Sn. The magnetic field producing the Landau states can be used in probability amplification.

Turning to the buffer 104, the buffer 104 permits the excitation processes in the source 102 to occur close enough to the surface of the source 102 so that an appreciable fraction of the excess electrons and excess holes far from the Fermi energy reach the surface of the source 102. For this to happen, the bottom of the conduction band in the source 102, where the localized states are disposed, lines up with a forbidden band of the buffer 104. A suitable buffer 104 may be a metal, insulator or semiconductor. The buffer 104 should be thin enough (about 10-50 Å) so that a substantial fraction of the energetic charges (electrons or holes) pass through to the filter 106. For example, if the buffer 104 is an insulator, the charges from the source 102 may tunnel through the buffer 104 to the filter 106.

Two cases are illustrated in FIGS. 5a and 5b. FIG. 5a illustrates the band diagram of a material that is not suitable as a buffer for a particular source. As shown in FIG. 5a, the localized states and bottom of the conduction band in the source 102 are aligned with the conduction band of the buffer 104, and the tops of the conduction band of the source 102 and buffer 104 are offset by energy $\Delta E_1$. The presence of the material forming the buffer 104 destroys the conditions in the source 102 in which excitations occur close to the interface. In this case, the number of energetic electrons increases with the distance from the interface as shown in the accompanying graph. As shown in FIG. 5b, the localized states and bottom of the conduction band in the source 102 are offset by energy $\Delta E_2$, and the tops of the conduction band of the source 102 and buffer 104 are aligned. If the bands of the filter 106 line up correctly with the source 102, the buffer 104 can be eliminated and the filter 106 may then serve as the buffer. In this case, the number of energetic electrons is constant with the distance from the interface as shown.

Turning to the filter 106, the filter 106 functions to conduct the high energy charges originating from the source 102 and to block the flow of electrons close to the Fermi surface. In one embodiment, the filter 106 comprises a semiconductor, e.g. an elemental semiconductor such as Si or Ge or a compound semiconductor such as a III-V semiconductor. Alternatively, the filter 106 may comprise an insulator such as $SiO_2$, CaO, or AlN. In various embodiments, the filter 106 may conduct high energy electrons and/or holes while blocking other charge carriers. For example, in one embodiment, the filter 106 conducts the high energy electrons and blocks all other charges. In another embodiment, the filter 106 conducts high energy holes and blocks all other charges. In another embodiment, both high energy electrons and high energy holes are transported through the filter 106. In this last case, the polarity of the output current of the current source 100 is determined by which charge carrier dominates. These embodiments are described below with regard to FIG. 6 in more detail.

Figure 8:
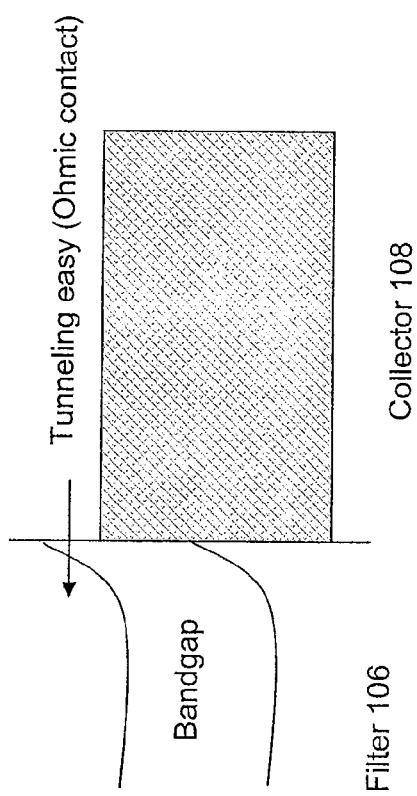
FIG. 8 shows a band diagram of the filter-collector region of an embodiment of a current source.
Figure 9:
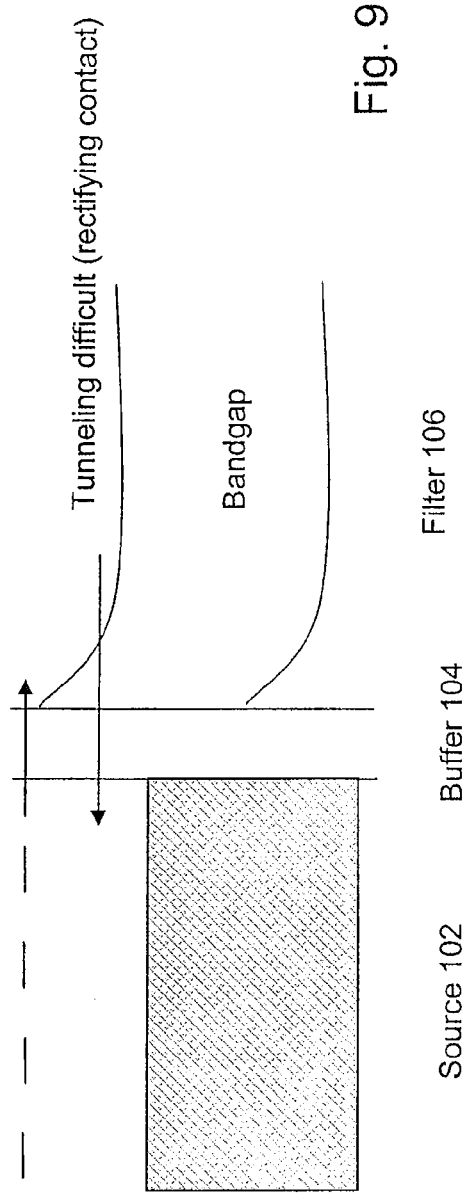
FIG. 9 shows a band diagram of the source-buffer-filter region of an embodiment of a current source.

The collector 108 may be a metal or a heavily doped semiconductor (e.g. about $10^{17}$ cm$^{-3}$ or more dopants) and can be any thickness above about 10 Å. If outside electrical connection is made to the collector 108, it should be at least about 1 micron thick. The collector 108 may chosen to make an ohmic contact with the semiconductor filter 106 in some cases, and in other cases to make a rectifying contact. As shown in FIG. 8, surface state pinning of the Fermi level largely determines the size of the barrier between metal and semiconductor. An ohmic contact between the filter 106 and collector 108 can be made in that case by heavily doping the collector side of the filter 106. A rectifying contact can be made at the buffer-filter interface by lightly doping the semiconductor on the buffer layer side as shown in FIG. 9. The choice of collector metal in this case can be based on compatibility with neighboring layers. Sn, for example, may be a good choice.

If the filter 106 is a II-VI semiconductor or other semiconductor that does not have surface state pinning, the nature of the contact between the semiconductor and metal may be determined by the relative positions of the Fermi level of the metal and the conduction and valence band edges of the semiconductor. For instance, Pd and Pt form a rectifying contact with ZnO. Sn and Al form an ohmic contact with ZnO.

Excitation processes in the source metal cause there to be more electrons and holes far from the Fermi energy than what is predicted by equilibrium statistical mechanics. The buffer 104 allows those energetic charges to reach the surface of the source 102 and to pass into and through the buffer 104, into the filter 106. The filter 106 allows some of the high energy charges to pass through into the collector 108. Because the collector 108 is an ordinary metal, it does not have a surplus of high energy charges that are able to pass through the filter 106. Consequently, charge builds up in the collector 108 and an electric field develops in the filter 106. The field grows until a balancing current flowing in the opposite direction develops. If the field grows too large, breakdown will occur in the semiconductor, destroying its ability to filter.

In addition, the filter 106 and collector 108 permit sufficient reverse current to flow so that breakdown does not occur. This can be done in a number of ways. If the semiconductor is thin enough (about 50 Å), tunneling can occur from the collector 108 to the buffer 104 or source 102. If the semiconductor has enough defects, such as amorphous silicon or germanium, conduction through defect states in the middle of the forbidden band can occur. If the collector metal forms an ohmic contact with the filter layer semiconductor, a Schottky diode is formed. As charge builds up in the collector, the Schottky diode becomes forward biased in the collector-source direction and a balancing reverse current can develop.

If the semiconductor in the filter 106 is undoped, thus having an intrinsically high resistance, the thickness of the filter 106 is limited to about 100 to 200 Å to prevent space-charge effects, which will produce instabilities in output current. If the semiconductor is doped or low resistance, the thickness can be above about 100 Å.

Possible semiconductors include Si, Ge, GaAs, AlAs, AlSb, $SnO_2$, among many others. Insulators that can be used include MgO and CaO. If the semiconductor also provides probability amplification as previously discussed, it has a large number of localized phonon modes. Mixture semiconductors include, such as $Al_xGa_{1-x}As$ or $AlAs_xSb_{1-x}$ or $ZnO_xS_{1-x}$, where x can vary from about 0.25 to 0.75. These mixtures are good semiconductors but have a disordered phonon spectrum with many localized modes. Those modes provide an alternating electric field, which when combined with an externally applied magnetic field provides probability amplification in the source. More complicated semiconductors such as organic semiconductors also can be used.

As described, the current source 100 includes a series of thin layers 102, 104, 106, and 108 of metals and semiconductors and/or insulators. The layers 102, 104, 106, and 108 may be fabricated by vacuum deposition such that they contact each other. Different vacuum deposition technologies may be suitable for fabrication of the current source 100. These vacuum deposition technologies include sputtering, chemical vapor deposition, and electron beam evaporation.

Deposition takes place in a vacuum chamber. The chamber includes a vessel capable of maintaining a vacuum. The chamber also has electrical feedthroughs that allow current to be fed to wires inside the chamber and a motion feedthrough, which allows a target inside the vessel to be moved, connected via vacuum tubing and valves to vacuum pumps. The vacuum chamber maintains a vacuum of less than about $10^{-6}$ torr during deposition. Material to be evaporated is placed in conical baskets made of tungsten filament, for example. If the material to be evaporated is in the form of wire or foil, it can simply be wrapped around a tungsten filament. One end of the tungsten filament is connected to an electrical feedthrough, while the other end of the tungsten filament is connected to a wall of the vessel, which serves as electrical ground. If voltage is applied to the electrical feedthrough from the outside, current flows through the filament, heating it and the material in contact with it. With enough current, the material gets hot enough to evaporate. Since it is in a vacuum, the atoms are emitted substantially uniformly in all directions. The target is placed on a carrier connected to the motion feedthrough so that it can be moved into optimal position to receive the evaporated material. Since the material, to a good approximation, is emitted substantially uniformly in all directions, the amount that hits the target, and thus the thickness of the layer, can be calculated from simple geometry and knowledge of the amount of material in the basket and the distance from the basket to the target. When the deposition of one layer is completed, the target is moved to a new position, current is run through another basket holding material for the next layer and the process is repeated. In this way, layers fabricated without a large amount of impurities occurring at the interface. Care is taken in the selection of material for adjoining layers as the deposited material may not uniformly coat the target but instead form islands on the top of the target, especially for exceedingly thin layers.

An example device contains a steel substrate on which a sequence of layers is formed. These layers may include 1000 Å of Sn, 100 Å of Ge, 30 Å of Pb, and 1000 Å of Pd. The 30 Å layer of Pb forms the buffer. The sequence can be repeated as many times as desired. After the desired number of repetitions of this sequence a final layer of 1 micron of Sn is deposited. If vacuum is broken to reload material, it may be done after the Pd deposition. This will introduce a thin layer (of about 20 Å) of PdO between the Pd and the next Sn layer. The 1000 Å layer of Sn forms the collector layer, the Ge forms the filter, the 30 Å layer of Pb forms the buffer, and the Pd forms the source.

The steel substrate may be a conventional steel washer having a diameter of about 1 cm. The steel substrate is cleaned, rinsed with distilled water, and dried using nitrogen gas, for example. The steel substrate may also be buffed to shine with a reasonable brightness using a soft cotton cloth. A single layer, such as Sn, may be deposited. If this layer is capable of being removed by an adhesive, such as a piece of Scotch tape, the substrate is cleaned again.

After a suitable cleaning, the disk is placed on carrier and deposition material is placed in baskets or on wires. To deposit the above layers, Sn is placed in a basket, Ge in a basket, Pb in a basket, and Pd wires wrapped around a tungsten filament. The system is evacuated and continuously pumped until a vacuum of $10^{-6}$ torr is achieved. This takes about 2 hours in one example of a vacuum system.

When the above vacuum is achieved, deposition may begin. First, 1000 Å of Sn is deposited, then 100 Å of Ge is deposited, followed by 30 Å of Pb. The Ge at this stage is in an amorphous form. The substrate is heated to 400K for 30 minutes to change the amorphous Ge to a polycrystalline Ge layer. After forming the polycrystalline Ge layer, 1000 Å of Pd is deposited in which the Pd is doped with Ag. To repeat this sequence, the chamber is opened up and reloaded with Sn, Ge, Pb, and Pd. The chamber is evacuated and the sequence is repeated. To finish, a 1 micron layer of Sn is deposited. Metal conductors are then attached to the top and bottom of the disk with conductive epoxy or soldered to make electrical connections.

FIGS. 6a, 6b, 6c show band diagrams of embodiments of different current sources. In each of these embodiments, the top of the conduction band in the source 102 is aligned with the top of the conduction band of the collector 108. In the embodiment shown in FIG. 6a, electrons that have been excited in the source 102 tunnel through the buffer 104 and transit across the filter 106 into the empty part of the conduction band of the collector 108. As shown, the top of the valence band of the filter 106 is below (i.e. has a lower energy than) the bottom of the conduction band of the source 102. In other words, the bottom of the bandgap of the filter 106, which is either a semiconductor or insulator, is below the bottom of the conduction band of the source 102. Thus, as there are no states in the bandgap of the filter 106, holes generated in the source 102 by the excitation of the electrons remain in the source 102.

In the embodiment shown in FIG. 6b, however, the valence band of the filter 106 extends to above the bottom of the conduction band of the source 102 while the bottom of the conduction band is at a higher energy than that of the excited electrons. Thus, holes in the source 102 tunnel through the buffer 104 and transit across the filter 106 into the occupied part of the conduction band of the collector 108 while the excited electrons generated in the source 102 remain in the source 102 as there are no states in the bandgap of the filter 106.

In the embodiment shown in FIG. 6c, both electrons, that have been excited in the source 102 and the holes left in the localized states, tunnel through the buffer 104 and transit across the filter 106. The electrons transit into the empty part of the conduction band of the collector 108 and the holes transit into the occupied part of the conduction band of the collector 108. As can be seen, the bandgap of the filter 106 is small enough such that the top of the valence band of the filter 106 is above the bottom of the conduction band of the source 102 and the bottom of the conduction band of the filter 106 is below the energy level of the excited electrons in the source 102.

Figure 7B:
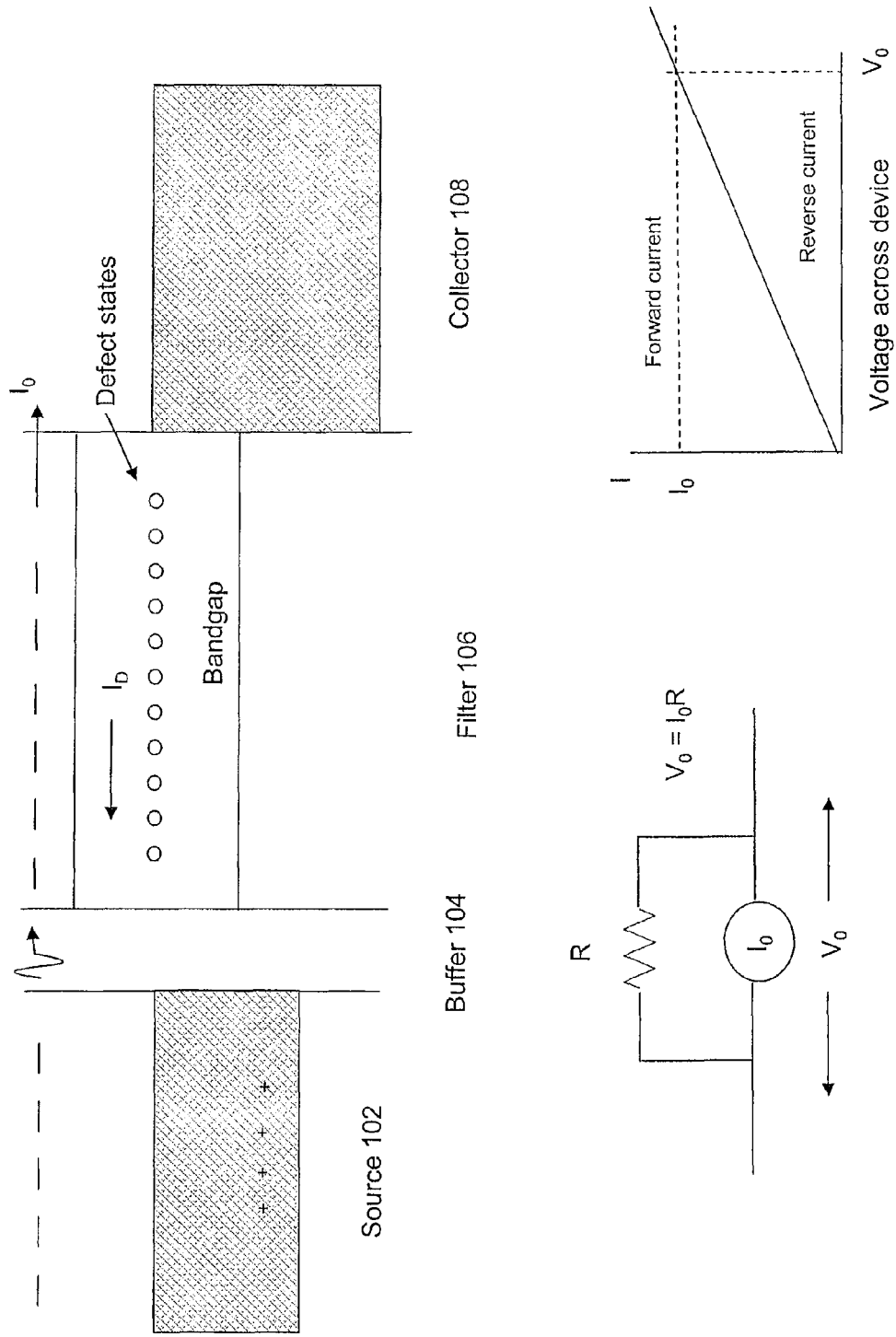
Figure 7C:
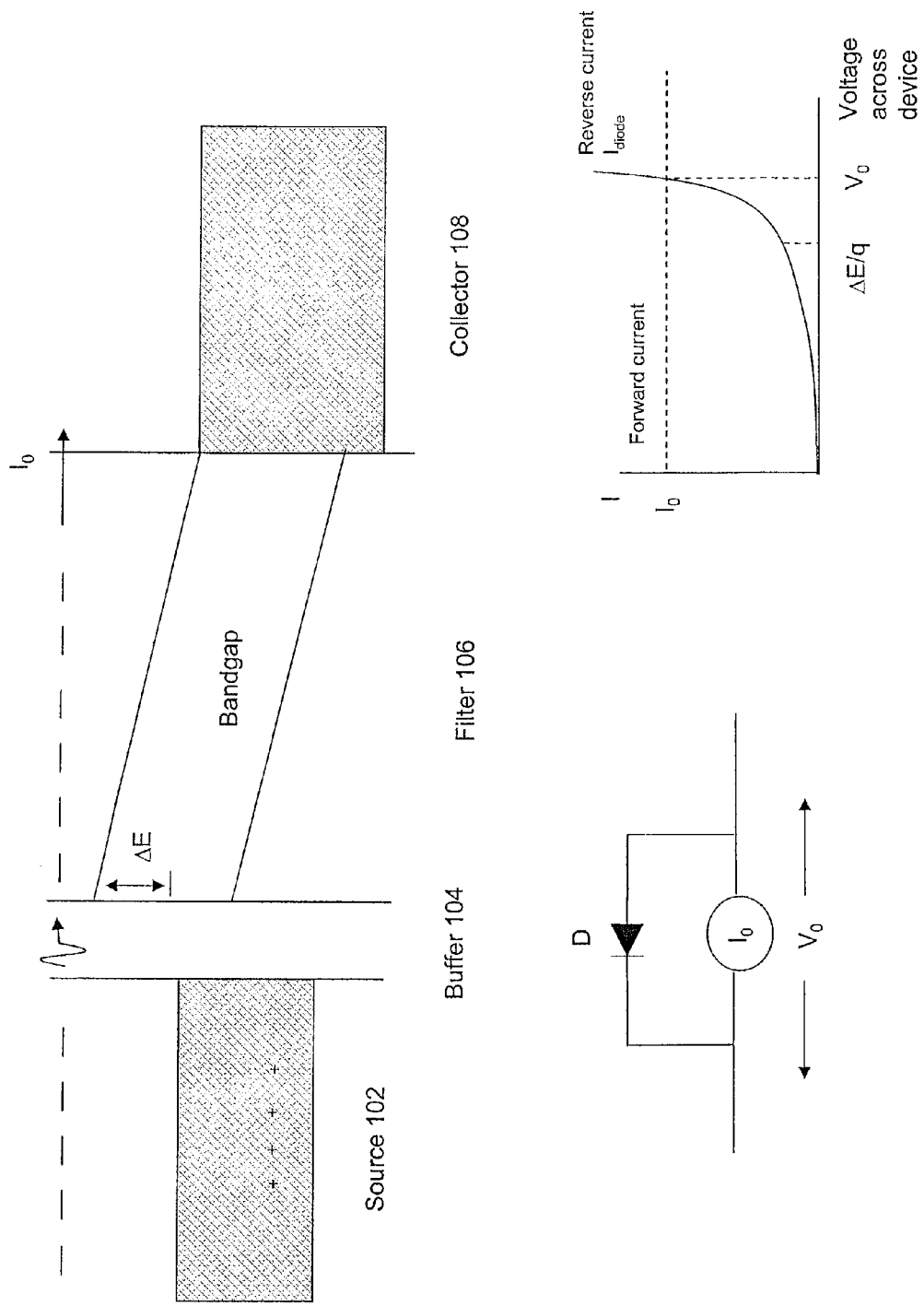

FIGS. 7a, 7b, and 7c show band diagrams and associated equivalent circuits and current-voltage graphs of different current sources. As shown in FIG. 7a, the electrons transit from the source 102 to the empty portion of the conduction band of the collector 108, forming the forward current $I_0$. In addition, electrons in the occupied portion of the conduction band of the collector 108 tunnel from the collector 108 to the collector of the source 102 through the bandgap of the filter 106, thereby forming the reverse current $I_T$. The magnitude of the reverse current $I_T$ is proportional to the voltage across the current source 100, the difference between the energy at the top of the occupied part of the conduction band in the collector 108 and the bottom of the conduction band in the filter 106, and exponentially decreases with increasing thickness of the filter 106. As the equivalent circuit diagram of the current source 100 looks like an ideal current source with a resistor R in parallel (the resistance of the current source 100), as shown, the voltage across the current source 100 is linear with the resistance R. Thus, while the forward current $I_0$ is constant, the reverse current $I_T$ increases linearly with the voltage $V_0$ across the current source 100.

As shown in FIG. 7b, another mechanism that can give rise to a reverse current is a current generated by defect hopping in the bandgap of the filter 106. This is to say that, if defects exist in the filter 106 due to imperfections in the lattice of the filter 106, for example, and these defects create defect states in the bandgap, a defect current, $I_D$ may be generated. Similar to FIG. 7a, the equivalent circuit diagram of the current source 100 in FIG. 7b looks like an ideal current source with a resistor R in parallel (the resistance of the current source 100). Thus, while the forward current $I_0$ is constant, the reverse current $I_D$ increases linearly with the voltage $V_0$ across the current source 100.

As shown in FIG. 7c, another mechanism that can give rise to a reverse current is a current generated by an internal electric field established in the filter 106 by the presence of the source 102 and the collector 108. This is to say that, when the current source 100 is fabricated, the conduction and valence band edges of the filter 106 may be pinned at the interfaces between the collector 108 and the buffer 108 (if present). This, in turn, can cause the conduction and valence band in the filter 106 to bend when the conduction bands of the source 102 and the collector 108 align and thus establish an internal electric field. In this case, the equivalent circuit diagram of the current source 100 in FIG. 7c looks like an ideal current source with a diode D in parallel (the resistance of the current source 100). As the current in a diode increases exponentially with voltage, again while the forward current $I_0$ is constant, the reverse current $I_{DIODE}$ increases linearly with the voltage $V_0$ across the current source 100.

Note that the specification and figures are to be regarded in an illustrative rather than a restrictive sense, and all such modifications are intended to be included within the scope of present invention. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

I claim:

1. A device comprising:
   a current source comprising a plurality of layers including a source metal and an adjacent layer, the source metal comprising a metal having a conduction band, localized states at a bottom of the conduction band, a Fermi surface and probability amplification, wherein the adjacent layer includes a forbidden energy band and the localized states of the metal align with the forbidden energy band of the adjacent layer, such that a substantial number of electrons in the localized states of the metal are energized to the Fermi surface of the metal, and energized electrons are produced above the Fermi surface;
   a collector comprising a metal or a doped semiconductor different from the source metal; and
   a load connected to the source metal and to the collector, wherein the energized electrons produce a spontaneous current by internal thermal energy in the current source in the absence of thermal energy applied to the source or to the collector, such that the current flows through the load and power is dissipated.

2. The device of claim 1, wherein the source metal comprises a disordered metal.

3. The device of claim 2, wherein the source metal comprises a plurality of different metals in which the atoms of the different metals are randomly disposed.

4. The device of claim 1, wherein the source metal comprises a pure transition metal.

5. The device of claim 1, wherein the source metal comprises impurities, and wherein if the source metal is a non-transition metal, the impurities are in the same column of the periodic table as the non-transition metal, and if the source metal is a transition metal, the impurities are in the same column as the transition metal or in a column to the right of the column of the transition metal.

6. The device of claim 1, further comprising a magnetic field source and an electric field source, wherein the source metal comprises a metal that is substantially free of disorder, the magnetic field source to apply a magnetic field substantially perpendicular to the first layer and the electric field source to apply an alternating electric field to the first layer, the electric field non-parallel with magnetic field.

7. The device of claim 6, wherein the adjacent layer comprises a high density of optically active localized phonon modes and the electric field source comprises the adjacent layer.

* * * * *